United States Patent
Oh

(10) Patent No.: US 7,250,897 B2
(45) Date of Patent: Jul. 31, 2007

(54) CMOS IMAGE SENSOR CAPABLE OF PERFORMING ANALOG CORRELATED DOUBLE SAMPLING

(75) Inventor: Hack-Soo Oh, Chungcheongbuk-do (KR)

(73) Assignee: MagnaChip Semiconductor Ltd., Chungcheongbuk-do (KR)

( * ) Notice: Subject to any disclaimer, the term of this patent is extended or adjusted under 35 U.S.C. 154(b) by 0 days.

(21) Appl. No.: 11/319,561

(22) Filed: Dec. 29, 2005

(65) Prior Publication Data

US 2006/0220940 A1  Oct. 5, 2006

(30) Foreign Application Priority Data

Mar. 29, 2005   (KR)   ............... 10-2005-0026135

(51) Int. Cl.
*H03M 1/12* (2006.01)

(52) U.S. Cl. ..................... 341/169; 341/155

(58) Field of Classification Search ......... 341/155–170
See application file for complete search history.

(56) References Cited

U.S. PATENT DOCUMENTS 6,727,486 B2 *   4/2004   Choi ................... 250/208.1

* cited by examiner

*Primary Examiner*—Lam T. Mai
(74) *Attorney, Agent, or Firm*—Morgan, Lewis & Bockius LLP

(57) ABSTRACT

A complementary metal oxide semiconductor (CMOS) image sensor capable of performing an analog correlated double sampling method is provided. The CMOS image sensor includes an image capturing unit for capturing an analog signal corresponding to an image of a subject; an analog-digital converting unit for converting the analog signal into a digital signal by using a ramp signal decreasing in a fixed slope according to a reference clock; a ramp signal generation unit for providing the ramp signal to the analog-digital converter; and a control unit for providing said units with control signals and outputting data to the outside through an interface.

6 Claims, 5 Drawing Sheets

CMOS IMAGE SENSOR CAPABLE OF PERFORMING ANALOG CORRELATED DOUBLE SAMPLING

FIELD OF THE INVENTION

The present invention relates to a complementary metal oxide semiconductor (CMOS) image sensor; and more particularly, to a CMOS image sensor capable of performing analog correlated double sampling.

DESCRIPTION OF RELATED ARTS

An image sensor is a device capturing an image by using a characteristic which a semiconductor reacts to the light. That is, in the image sensor, pixels detect different brightness and wavelengths of the light coming from a subject to thereby output the detected different brightness and wavelengths of the light as electrical values, and the electrical values are converted to voltage levels that can be subjected to a signal process.

A charge coupled device (CCD) has been conventionally used as an image sensor. However, recently, a complementary metal oxide semiconductor (CMOS) image sensor is widely used because the CMOS image sensor can reduce power consumption and increase productivity by employing a CMOS process.

That is, if comparing the CMOS image sensor with the CCD image sensor, the CMOS image sensor can employ both an analog control circuit and a digital control circuit in its image sensor chip. Thus, the CMOS image sensor includes an analog to digital converter (ADC) therein while the CCD image sensor uses an ADC implemented in a separate chip.

Meanwhile, the ADC included in the CMOS image sensor has comparators as many as the number of columns of pixel arrays within the image sensor. Since the comparator performs a role of converting a pixel signal into a digital signal, the comparator is a component providing a great influence on the quality of an outputted image.

FIG. 1 shows a block diagram of a conventional CMOS image sensor capable of performing digital correlated double sampling (CDS).

Referring to FIG. 1, the CMOS image sensor includes a pixel array 10 in which a plurality of pixels are arrayed in a bayer pattern; a ramp signal generation unit 40 for generating a ramp signal; a comparator array unit 20 for comparing analog output voltages from the pixel array 10 with the ramp signal to convert analog pixel signals into digital signals; a latch array unit (or line buffer) 30 for storing the digital signals outputted from the comparator array unit 20; a control unit 50 for providing control signals used in controlling the aforementioned units and outputting data to the outside through an interface; and a row decoder 60 for outputting a signal selecting a certain row of the pixel array 10 based on a control signal transmitted from the control unit 50.

The comparator array unit 20 includes comparators as many as the number of columns of the pixel array 10. Each of the comparators serves a role of converting an analog pixel value of a column in which it is located into a digital signal. The digital signal is stored in the latch array unit 30 including latches as many as the number of the columns of the pixel array 10. The digital signals stored in the latch array unit 30 are subjected to an image processing by the control unit 50 and then, sequentially outputted through output pins of the image sensor in the image processed order.

The row decoder 60 selects the certain row of the pixel array 10 to thereby make pixel values corresponding to the selected row transmitted to the comparator array unit 20. The comparator array unit 20 compares the pixel values with the ramp signal which is coupled from the ramp signal generation unit 40 to all comparators therein. The ramp signal transferred at this time is compared with the pixel values.

FIG. 2 is a circuit diagram illustrating a conventional path of converting a pixel value of a unit pixel into a digital signal and storing the digital signal in the image sensor shown in FIG. 1. FIG. 3 is a waveform diagram explaining a CDS operation described in FIG. 2.

Hereinafter, with references to FIGS. 2 and 3, there will be explained in detail steps of converting an analog pixel value into a digital signal and storing the digital signal according to the CDS method in the conventional CMOS image sensor.

The signal processing path corresponding to the unit pixel is comprised of a unit pixel 100 for outputting a voltage value corresponding to the brightness of the external light, a ramp signal generation unit 400 for outputting a ramp signal, a chopper comparator 200 for comparing the ramp signal with the voltage value from the unit pixel 100 and outputting a digital value, a counter 310 for counting the digital value outputted from the chopper comparator 200, and a latch cell 300 for storing a count value of the counter 310.

Meanwhile, the unit pixel 100 includes a photodiode PD for outputting photoelectric charges generated according to the external light, a transfer transistor Tx for transferring the photoelectric charges generated in the photodiode PD to a floating sensing node FD, a reset transistor Rx for resetting the floating sensing node FD to output a reset value during the CDS operation, a drive transistor Dx forming a source follower for generating a constant current between a source and a drain in proportion to a voltage corresponding to the photoelectric charges transferred to the floating sensing node FD to which a gate of the driver transistor Dx is connected, a select transistor Sx for outputting a signal transferred through the drive transistor Dx to its output node $N_1$ in response to a row select signal R_Select, and a current source Is.

By using the above described constitutional elements, an analog CDS method is performed instead of a digital CDS method. That is, as for the analog CDS method, an analog signal outputted from a unit pixel of the CMOS image sensor and an offset voltage are stored in a capacitor and then, the ramp signal and the offset voltage are stored in another capacitor. Afterwards, the offset voltage is offset by switching and voltage levels of the ramp signal and the analog signal of the pixel are compared to each other. Through the analog CDS method, the offset voltage existing in each pixel is removed, resulting in decreasing a fixed pattern noise.

The chopper comparator 200 includes two switches $S_1$ and $S_2$ individually connected to two input signal nodes $N_1$ and $N_2$, a capacitor $C_3$ connected between the two switches $S_1$ and $S_2$, a capacitor $C_2$ connected between a common node of the capacitor $C_3$ and the switch $S_1$ and an input node $N_3$ of an inverter INV1, a switch $S_3$ connected between the input node $N_3$ and an output node of the inverter INV1, an inverter INV2 connected to the inverter INV1 in series, a capacitor $C_1$ connected between the inverter INV1 and the inverter INV2, and a switch $S_4$ connected between an input node and an output node of the inverter INV2.

Herein, the capacitor $C_1$ stores a clamp voltage of a stage comprised of the inverter INV2 and the switch $S_4$ and the capacitor $C_2$ stores a clamp voltage of a stage comprised of the inverter INV1 and the switch $S_3$.

The input node and the output node of the inverter INV1 and those of the inverter INV2 are short-circuited by the switch $S_3$ and the switch $S_4$, respectively. When short-circuited, the clamp voltage is induced.

As described above, the chopper comparator 200 includes the switches $S_1$ to $S_4$ implemented with metal oxide semiconductor (MOS) transistors and has an offset voltage due to an injection of electric charges as follows as:

$$V_{offset} = V_{th}/A_1 A_2, \qquad \text{EQ. 1}$$

wherein $V_{th}$ represents a logic threshold voltage for the next circuit of the chopper comparator 200; and $A_1$ and $A_2$ show gains of the afore-mentioned two stages, respectively. As the gains $A_1$ and $A_2$ get larger, i.e., as the inverters are designed to have larger size, their offset voltages can be reduced. As a result, fixed pattern noises induced by the offset voltages can be also reduced.

FIG. 3 is a waveform diagram of signals employed in the chopper comparator shown in FIG. 2. Herein, the same reference denotations and the same reference numerals shown in FIG. 2 are identically used in FIG. 3.

With reference to FIG. 3, an operation of the chopper comparator 200 will be examined step by step. At the first step A, a reset voltage of the pixel 100 is stored in the capacitor $C_3$. At the second step B, a voltage corresponding to an actual data value of the pixel 100 is stored in the capacitor $C_2$. Then, the switches $S_3$ and $S_4$ are turned on, i.e., the inverters INV1 and the INV2 are clamped and thus, a voltage obtained at an operating point of the inverter INV2 is stored in the capacitor $C_1$.

At the third step C, the ramp signal generation unit 400 and the counter 310 are activated. Afterwards, a ramp signal $V_{ramp}$ provided from the ramp signal generation unit 400, which is stored in the capacitor $C_3$, and an output of the pixel 100 stored in the capacitor $C_2$ are compared to each other and then, the compared value is stored in the latch cell 300.

Waveforms corresponding to the aforementioned three steps A, B and C are illustrated in FIG. 3 and hereinafter, the individual steps will be explained in detail.

At the first step A, if the transfer transistor Tx is turned off and the reset transistor Rx and the select transistor Sx are turned on, a reset voltage $V_{reset}$ is induced at the gate of the drive transistor Dx and a voltage decreased by as much as the logic threshold voltage $V_{th}$, i.e., '$V_{reset} - V_{th}$', is induced at the node $N_1$.

However, since an offset voltage exists in a typical logic threshold voltage $V_{th}$, '$V_{reset} - (V_{th} + V_{offset})$' is exactly induced at the node $N_1$.

Meanwhile, a start voltage $V_{start}$ of the ramp signal $V_{ramp}$ outputted from the ramp signal generation unit 400 is coupled to the node $N_2$. At this time, the level of the ramp signal $V_{ramp}$ is equal to that of the start voltage $V_{start}$, i.e., '$V_{ramp} = V_{start}$'.

Furthermore, at the first step A, the switches $S_1$ and $S_2$ are turned on and thus, a voltage shown in the following equation EQ. 2 is stored in the capacitor $C_3$. Afterwards, the switch $S_2$ is immediately turned off.

$$V_{C3} = V_{reset} - (V_{th} + V_{offset}) - V_{start} \qquad \text{EQ. 2}$$

At the second step B, the voltage corresponding to the actual data value of the pixel 100 should be transferred to the chopper comparator 200. Thus, by turning on the transfer transistor Tx in a state of the reset transistor Rx turned off, the variation of the gate voltage of the drive transistor Dx according to a change in a voltage corresponding to an amount of electric charges transferred to the floating sensing node FD and an output value at the node $N_1$, resulted from the above voltage variation are obtained. At this time, a voltage $V_{N1}$ of the node $N_1$, equals a value of '$V_{pixel} - (V_{th} + V_{offset})$', i.e., '$V_{N1} = V_{pixel} - (V_{th} + V_{offset})$'. The switches $S_3$ and $S_4$ are turned on to thereby induce voltages corresponding to operating points of the inverters INV1 and INV2 in the capacitors $C_2$ and $C_1$, respectively. The voltages induced in the capacitors $C_2$ and $C_1$ are '$V_{clamp1}$' and '$V_{clamp2}$', respectively.

Herein, because the switch $S_1$ has been turned on since the first step A, a voltage shown in the following equation EQ. 3 is stored in the capacitor $C_2$ and a voltage described in the following equation EQ. 4 is stored in the capacitor $C_1$.

$$V_{C2} = V_{pixel} - (V_{th} + V_{offset}) - V_{clamp1} \qquad \text{EQ. 3}$$

$$V_{c1} = V_{clamp1} - V_{clamp2} \qquad \text{EQ. 4}$$

To maintain the stored voltages as shown in the above equations EQ. 3 and EQ. 4, the switches $S_1$, $S_3$ and $S_4$ are immediately turned off.

In summary of the first step A and the second step B, a voltage value of '$V_{reset} - (V_{th} + V_{offset}) - V_{clamp1}$' is subjected to sampling in the capacitor $C_3$ at the first step A and the voltage value of '$V_{pixel} - (V_{th} + V_{offset}) - V_{clamp1}$' is subjected to sampling in the capacitor $C_2$ at the second step B. Afterwards, offset values of the capacitors $C_2$ and $C_3$ are offset each other, thereby being removed.

At the third step C, the switch $S_2$ is turned on to compare the ramp signal outputted from the ramp signal generation unit 400 with the voltage value stored in the pixel 100. Meanwhile, although the switch $S_2$ is tuned on, the capacitors $C_1$, $C_2$ and $C_3$ continuously maintain their own voltages because the remaining switches $S_1$, $S_3$ and $S_4$ remain turned off.

At this time, a voltage $V_{N3}$ of the node N3 corresponding to the input node of the inverter INV1 is determined as follows.

$$V_{N3} = V_{ramp} + V_{C3} - V_{C2} \qquad \text{EQ. 5}$$

If the equations EQ. 2 and EQ. 3 are substituted for the equation EQ. 5, the following equation EQ. 6 can be obtained.

$$V_{N3} = V_{ramp} - V_{start} + V_{reset} - V_{pixel} + V_{clamp1} \qquad \text{EQ. 6}$$

Since the start voltage of the ramp signal $V_{ramp}$ outputted from the ramp signal generation unit 400 is denoted with '$V_{start}$', if '$V_{start}$' is substituted for the equation EQ. 6, the following equation EQ. 7 can be obtained.

$$V_{N3} = V_{reset} - V_{pixel} + V_{clamp1} \qquad \text{EQ. 7}$$

Referring to the equation EQ. 7, it is noticed that $V_{th}$ and $V_{offset}$ existing in $V_{C3}$ and $V_{C2}$ are removed and $V_{C3}$ and $V_{C2}$ are expressed with the data value $V_{pixel}$ and the reset voltage $V_{reset}$. That is, it is shown that the analog CDS method is performed through the above described steps.

Herein, the remaining '$V_{reset} - V_{pixel}$' illustrates a pure analog pixel data value subjected to the CDS method.

Meanwhile, since the clamp voltage of the inverter INV1 is denoted with '$V_{clamp}$', a moment at which $V_{N3}$ denoting the voltage of the node N3, i.e., $V_{N3} = V_{reset} - V_{pixel} + V_{clamp1}$, equals $V_{clamp1}$ becomes a comparison moment.

At the third step C, a latch enable signal Latch_EN is set as a 'logic high' to actuate the latch cell 300. As the ramp signal $V_{ramp}$ outputted from the ramp signal generation unit 400 is gradually decreased, the count value of the counter 310 is increased every clock one by one.

The ramp signal $V_{ramp}$ can be expressed as follows as:

$$V_{ramp}=V_{start}-\Delta V, \quad \text{EQ. 8}$$

wherein $\Delta V$ illustrates a voltage value of the ramp signal $V_{ramp}$ changing according to a clock.

If the equation EQ. 8 is substituted for the equation EQ. 6, the input voltage of the inverter INV1 can be illustrated as follows.

$$V_{N3}=(V_{reset}-V_{pixel}-\Delta V+V_{clamp1}) \quad \text{EQ. 9}$$

The value of $\Delta V$ is increased by the ramp signal $V_{ramp}$ and as time passes, it becomes equal to a value of '$V_{reset}-V_{pixel}$'. At this moment, the input voltage of the inverter INV1 becomes its operation voltage $V_{clamp1}$ as simultaneously as the input voltage of the inverter INV2 becomes its operation voltage $V_{clamp2}$. Thus, the two inverters INV1 and INV2 are located at their operating points.

A moment at which the two inverters INV1 and INV2 are at their operation points is called the comparison moment denoted with 'x'. At this time, if the ramp signal $V_{ramp}$ is dropped a little bit, the dropped ramp signal is amplified by the gains of the inverters INV1 and INV2 and an output voltage $V_o$ becomes a ground voltage. Herein, a moment at which the ramp signal $V_{ramp}$ is dropped is denoted with 'y'.

As described above, if the output voltage $V_o$ is dropped to the ground voltage, the count value of the counter 301 that has been subject to counting is finally stored in the latch cell 300. The count value stored in the latch cell 300 becomes a digital value corresponding to a data of the pixel 100.

To maintain the count value stored in the latch cell 300 until being transferred to a control unit, the latch enable signal (Latch_EN) is set to a 'logic low'.

As for the chopper comparator 200 as described above, since current flows into the inverters INV1 and INV2 only during the comparison moment, a static current is almost not occurred, resulting in reducing power consumption. Also, since a comparison operation is carried out by generating a ramp signal only once, it is obtained an advantage of reducing an operation of a whole chip and a control algorithm.

FIG. 4 illustrates a circuit diagram of the CMOS type inverters INV1 and INV2 used in the chopper comparator shown in FIG. 3. FIG. 5 provides a graph of illustrating the variation of a clamp voltage according to a power voltage of the inverters INV1 and INV2 shown in FIG. 4.

Referring to FIG. 4, the CMOS inverter includes a P-type metal oxide semiconductor (PMOS) transistor $P_1$ and an N-type metal oxide semiconductor (NMOS) transistor $N_1$. Since gates of the PMOS transistor $P_1$ and the NMOS transistor $N_1$ are commonly connected with each other, an input signal Vin can be transferred to the both transistors $P_1$ and $N_1$. Also, the PMOS transistor $P_1$ and the NMOS transistor $N_1$ are connected in series between a power voltage terminal VDD and a ground voltage terminal VSS.

An operation of the CMOS inverters INV1 and INV2 are carried out by outputting a reversed output signal Vout of the input signal Vin.

Since the chopper comparator compares a signal transferred from a pixel with a clamp signal of an inverter and uses the CMOS type inverters, the clamp voltage $V_{clamp}$ is severely fluctuated according to the variation of the power voltage VDD.

The fluctuation of the clamp voltage $V_{clamp}$ degrades a differential nonlinearlity (DNL) property of an ADC having a column parallel structure, resulting in increasing random noises on a screen.

SUMMARY OF THE INVENTION

It is, therefore, an object of the present invention to provide a complementary metal oxide semiconductor (CMOS) image sensor capable of performing an analog correlated double sampling (CDS) method, wherein by carrying out the analog CDS method, a change in a clamp voltage according to a fluctuation in a power voltage of a CMOS type inverter comprising a chopper comparator can be decreased in the CMOS image sensor using the chopper comparator to perform an analog CDS method.

In accordance with one aspect of the present invention, there is provided a CMOS image sensor, including: an image capturing unit for capturing an analog signal corresponding to an image of a subject; an analog-digital converting unit for converting the analog signal into a digital signal by using a ramp signal decreasing in a fixed slope according to a reference clock; a ramp signal generation unit for providing the ramp signal to the analog-digital converter; and a control unit for providing said units with control signals and outputting data to the outside through an interface, wherein the analog-digital converter includes: a chopper comparator comparing the analog signal and the ramp signal; an input capacitor inducing a voltage value corresponding to a start voltage of the ramp signal in a reset mode and a voltage value corresponding to the ramp signal decreasing according to the reference clock in a counter mode; and a counter, wherein the chopper comparator has: a plurality of inverters having a common source amplifier structure; a plurality of switches controlled by the control unit; and a plurality of capacitors.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, detailed descriptions of preferred embodiments of the present invention will be provided with reference to the accompanying drawings.

Figure 1:
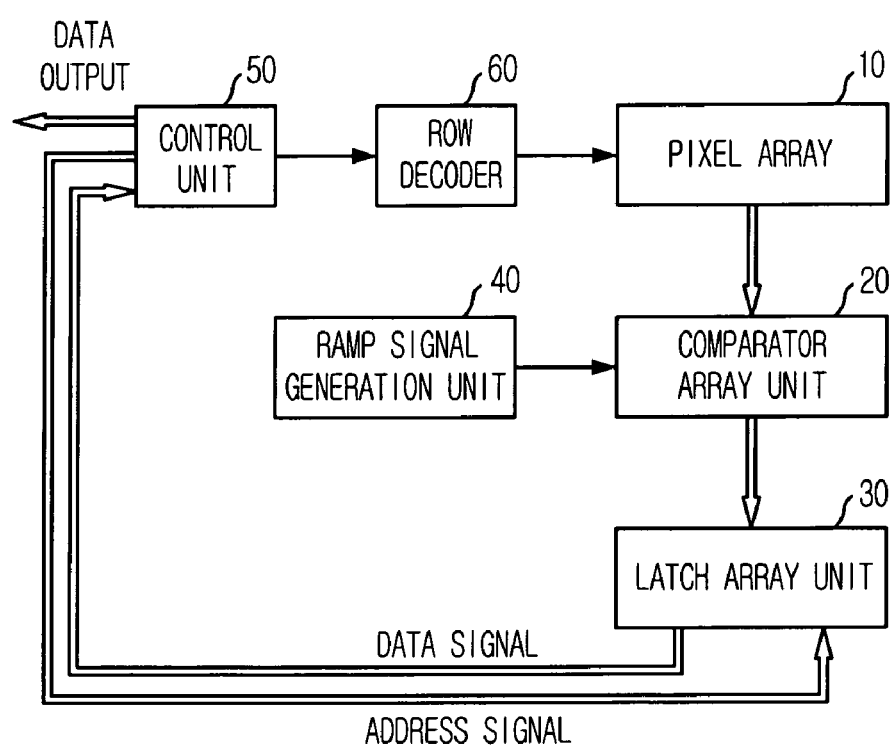
FIG. 1 is a block diagram illustrating a conventional complementary metal oxide semiconductor (CMOS) image sensor supporting a digital correlated double sampling (CDS) method.

A complementary metal oxide semiconductor (CMOS) image sensor in accordance with a preferred embodiment of the present invention includes the same constitutional elements as the conventional CMOS image sensor shown in FIG. 1. Accordingly, since the constitutional elements of the CMOS image sensor are already explained in the description of the related arts, the explanations about the constitutional elements of the CMOS image sensor in accordance with the preferred embodiment of the present invention will be omitted herein.

Figure 2:
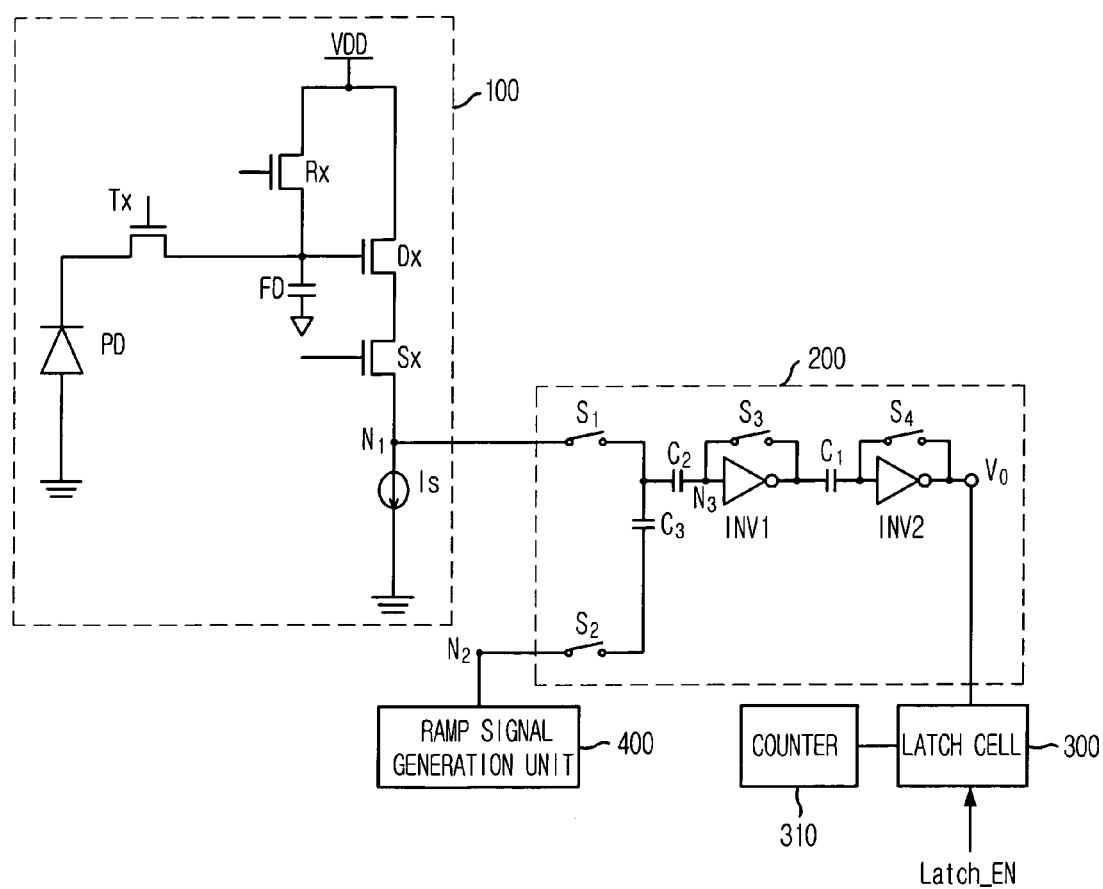
FIG. 2 is a circuit diagram illustrating a conventional path for converting a pixel value of a unit pixel into a digital signal and storing the converted digital signal in the block diagram shown in FIG. 1.
Figure 3:
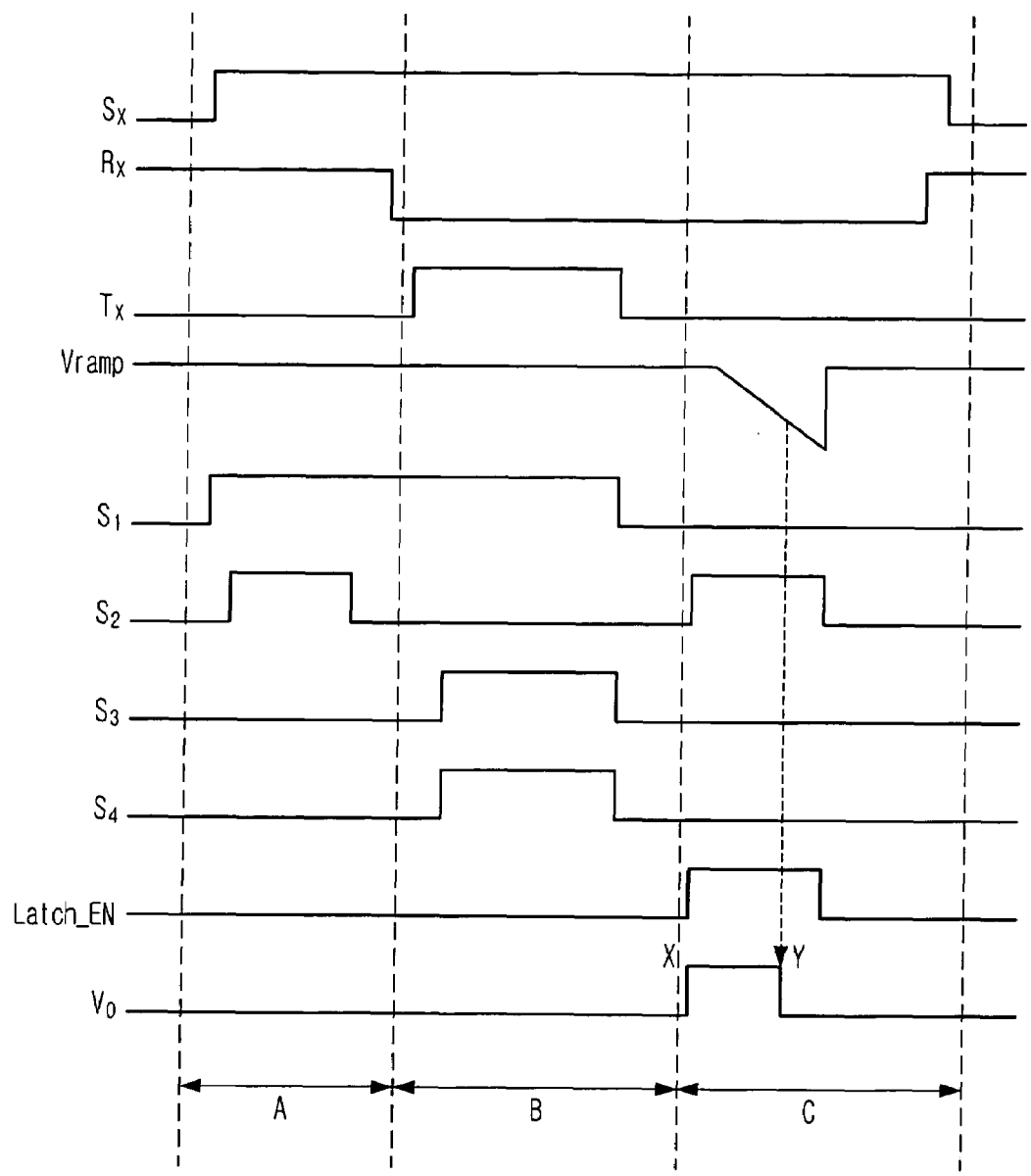
FIG. 3 is a wave form diagram explaining a CDS operation shown in FIG. 2.
Figure 4:
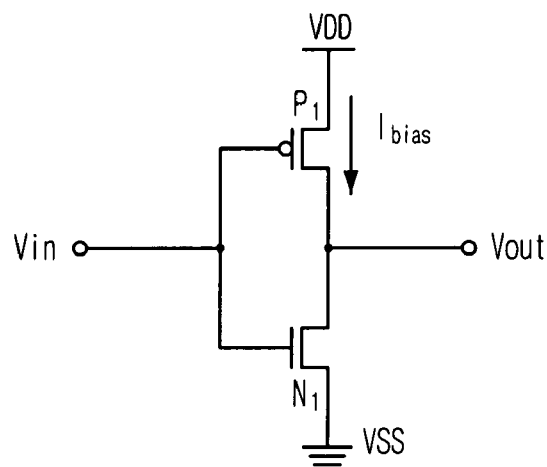
FIG. 4 is a circuit diagram illustrating a CMOS type inverter used in FIG. 3.
Figure 5:
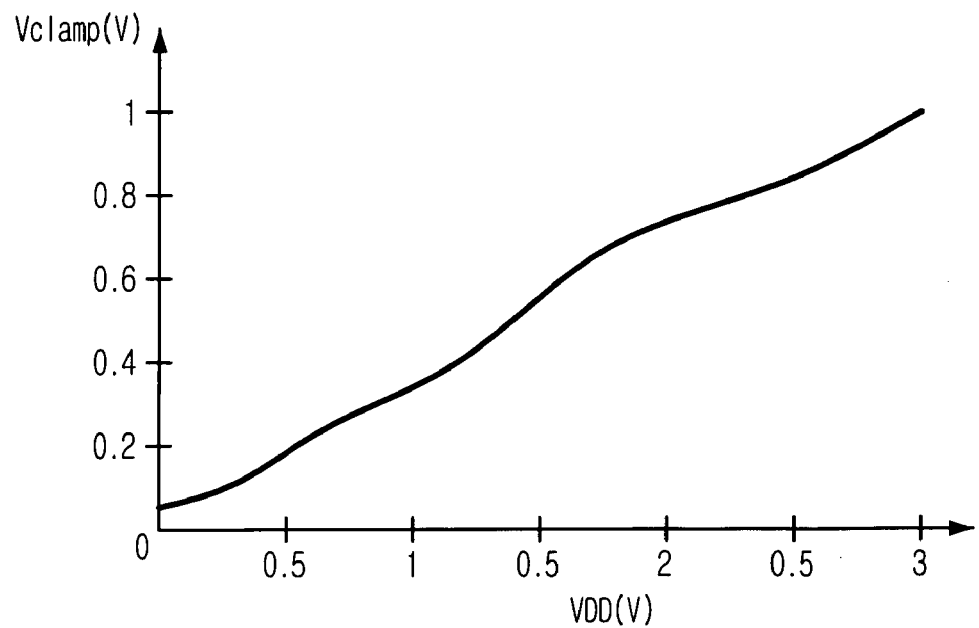
FIG. 5 is a graph illustrating a change in a clamp voltage according to a power voltage of the CMOS type inverter shown in FIG. 4.

Furthermore, a path for converting a pixel value of a pixel to a digital signal and storing the converted digital signal, and waveforms illustrating a correlated double sampling (CDS) operation are identical to those shown in FIGS. 2 and 3. Thus, detailed explanations about the path and the CDS operation will be also omitted herein.

Accordingly, the image sensor in accordance with the present invention includes an image capturing unit for capturing an analog signal corresponding to an image of a subject, an analog-digital converter for converting the analog signal into a digital signal by using a ramp signal decreasing in a fixed slope according to a reference clock, and a ramp signal generation unit for providing the ramp signal to the analog-digital converter.

The analog-digital converter is comprised of a chopper comparator for comparing the analog signal and the ramp signal, an input capacitor for inducing a voltage value corresponding to a start voltage of the ramp signal in a reset mode and a voltage value corresponding to the ramp signal decreasing according to the reference clock in a counter mode, thereby removing an offset voltage of the CMOS image sensor, and a counter.

The chopper comparator has a plurality of inverters, a plurality of switches controlled by a control unit, and a plurality of capacitors. A latch unit stores a digital value subjected to a CDS process and outputted from the analog-digital converter.

Figure 6:
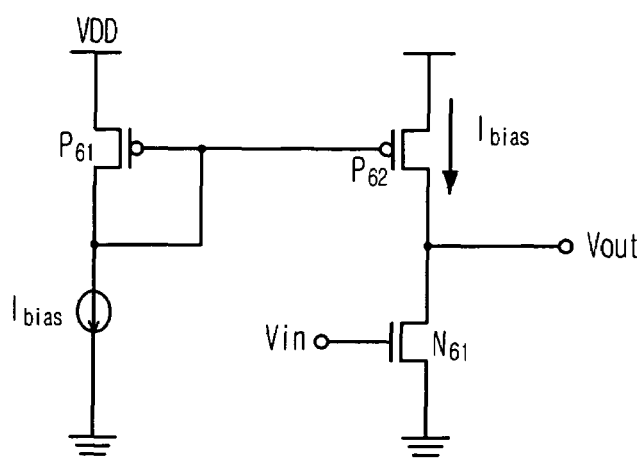
FIG. 6 is a circuit diagram illustrating an inverter comprised of a common source amplifier in accordance with a specific embodiment of the present invention.

FIG. 6 is a circuit diagram of an inverter comprised of a common source amplifier in accordance with a preferred embodiment of the present invention.

Referring to FIG. 6, the inverter includes a P-type MOS (PMOS) transistor $P_{61}$, connected to a current source in series between a power voltage terminal VDD and a ground voltage terminal VSS and having a gate and a first node which are diode-connected with each other; the other PMOS transistor $P_{62}$ having a first node connected to an output terminal Vout, a gate connected to a common node of the gate and the first node of the PMOS transistor $P_{61}$, and a second node connected to the power voltage terminal VDD; and an N-type MOS (NMOS) transistor $N_{61}$ having a gate connected to an input terminal Vin and connected between the output terminal Vout and the ground voltage terminal VSS.

In the inverter shown in FIG. 6, since the first node of the PMOS transistor $P_{62}$ and that of the NMOS transistor $N_{61}$ are commonly connected with each other, the inverter is called the common source amplifier. Also, since the gate of the PMOS transistor $P_{62}$ is connected to the gate and first node of the PMOS transistor $P_{61}$ which are diode-connected with each other, it is formed a current mirror. Accordingly, the source/drain current flowing through the PMOS transistors $P_{61}$ and $P_{62}$ is identical to a current $I_{bias}$ flowing in the current source.

In case that a signal of a power voltage VDD level is inputted to the NMOS transistor $N_{61}$ through the input terminal Vin, the NMOS transistor $N_{61}$ is turned on and thus, the output terminal Vout becomes to have a ground voltage VSS level. On the other hand, in case that a signal of the ground voltage VSS level is inputted to the NMOS transistor $N_{61}$ through the input terminal Vin, the NMOS transistor $N_{61}$ is turned off and thus, the output terminal Vout becomes to have the power voltage VDD level.

If the inverter having the aforementioned common source amplifier structure is used in the chopper comparator, a switch is connected between the input terminal Vin and the output terminal Vout. Accordingly, a clamp voltage of the inverter corresponds to a voltage level in the case which the switch is turned on.

Figure 7:
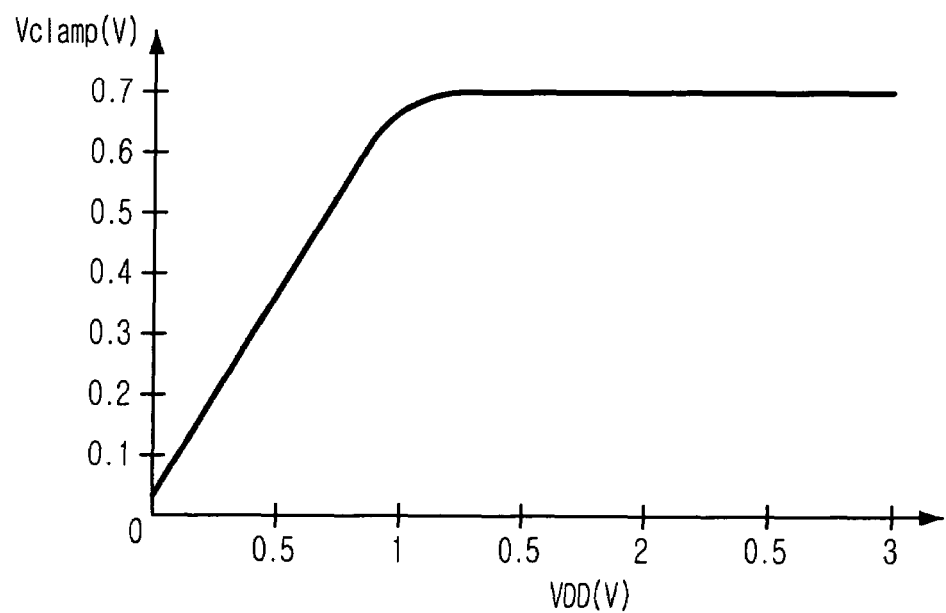
FIG. 7 is a graph illustrating a change in a clamp voltage according to a change in a power voltage of the inverter shown in FIG. 6.

FIG. 7 is a graph illustrating the variation of the clamp voltage according to the variation of the power voltage of the inverter shown in FIG. 6.

In case that the switch is turned on, the input terminal Vin and the output terminal Vout are actually connected with each other. Thus, the gate and the first terminal of the NMOS transistor $N_{61}$ is diode-connected with each other in the inverter structure shown in FIG. 6.

At this time, an output voltage is increased according to an input voltage and it is maintained in the same level, i.e., a threshold voltage, after the input voltage reaches the threshold voltage of the NMOS transistor $N_{61}$.

That is, since the current $I_{bias}$ is independent of the power voltage VDD, although the power voltage VDD is fluctuated, the bias current of the common source amplifier is constant and the clamp voltage is very stably maintained at a level higher than a certain voltage level.

Accordingly, it is possible to reduce a random noise due to the fluctuation of the clamp voltage of the inverter.

As described above, in accordance with the present invention, the chopper comparator of the CMOS image sensor for performing the analog CDS method includes the inverter having the common source type amplifier structure capable of constantly maintaining its clamp voltage by employing the bias current independent of the power voltage VDD. Therefore, it is possible to reduce the random noise.

In accordance with the present invention, the random noise on a screen can be reduced and thus, it is obtained an effect of improving the image quality of the CMOS image sensor.

The present application contains subject matter related to the Korean patent application No. KR 2005-0026135, filed in the Korean Patent Office on Mar. 29, 2005, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A complementary metal oxide semiconductor (CMOS) image sensor, comprising:

an image capturing unit for capturing an analog signal corresponding to an image of a subject;

an analog-digital converter for converting the analog signal into a digital signal by using a ramp signal decreasing in a fixed slope according to a reference clock;

a ramp signal generation unit for providing the ramp signal to the analog-digital converter; and a control unit for providing at least one of the image capturing unit, the anolog-digital converter, and the ramp signal generation unit with control signals and outputting data through an interface, wherein the analog-digital converter includes:

a chopper comparator for comparing the analog signal with the ramp signal;

an input capacitor for inducing a first voltage value corresponding to a start voltage of the ramp signal in a reset mode and a second voltage value corresponding to the ramp signal decreasing according to the reference clock in a counter mode; and a counter, wherein the chopper comparator has:
- a plurality of inverters having a common source amplifier structure;
- a plurality of switches controlled by the control unit; and
- a plurality of capacitors,
- wherein at least one of the inverters includes:
  - a current mirror circuit connected between a power voltage terminal and an output terminal; and
  - an N-type metal oxide semiconductor (NMOS) transistor, connected between the output terminal and a ground voltage terminal, having a gate connected to an input terminal.

2. The CMOS image sensor of claim 1, wherein the current mirror circuit includes:
- a current source;
- a first P-type metal oxide semiconductor (PMOS) transistor, connected between the power voltage terminal and a first node coupled to the current source, having a gate coupled to the first node; and
- a second PMOS transistor, connected between the power voltage terminal and the output terminal, having a gate connected to the first node.

3. The CMOS image sensor of claim 1, further comprising a latch unit for storing the digital signal outputted from the analog-digital converter.

4. The CMOS image sensor of claim 3, wherein the chopper comparator includes:
- a first switch connected to a first signal node;
- a second switch connected to a second signal node;
- a first capacitor connected to the first switch;
- a first inverter connected to the first capacitor;
- a third switch connected between an input node of the first inverter and an output node of the first inverter;
- a second capacitor connected to the output node of the first inverter;
- a second inverter connected to the second capacitor; and
- a fourth switch connected between an input node of the second inverter and an output node of the second inverter,
- wherein the input capacitor is connected between the first switch and the second switch, and an output of the second inverter is connected to the latch unit.

5. The CMOS image sensor of claim 4, wherein, in response to a corresponding control signal from the control unit, the first switch is turned on in both of the reset mode and a charge transferring mode in which the analog signal corresponding to the image of the subject is transferred to the analog-digital converter.

6. The CMOS image sensor of claim 5, wherein the first, the third and the fourth switches are turned on during the charge transferring mode in response to corresponding control signals from the control unit.

* * * * *